United States Patent
Masuda et al.

(10) Patent No.: US 6,812,785 B2
(45) Date of Patent: Nov. 2, 2004

(54) DIGITAL POWER AMPLIFIER AND DIGITAL/ANALOG CONVERTER

(75) Inventors: Toshihiko Masuda, Tokyo (JP); Takashi Shima, Kanagawa (JP)

(73) Assignee: Sony Corporation, Tokyo (JP)

( * ) Notice: Subject to any disclaimer, the term of this patent is extended or adjusted under 35 U.S.C. 154(b) by 252 days.

(21) Appl. No.: 10/210,769

(22) Filed: Aug. 1, 2002

(65) Prior Publication Data

US 2003/0038674 A1 Feb. 27, 2003

(30) Foreign Application Priority Data

Aug. 8, 2001 (JP) ..................................... P2001-240911

(51) Int. Cl.[7] .............................................. H03F 3/38
(52) U.S. Cl. ...................... 330/10; 330/207 A; 330/251
(58) Field of Search ...................... 330/10, 251, 207 A; 375/328

(56) References Cited

U.S. PATENT DOCUMENTS

| | | | | |
|---|---|---|---|---|
| 4,724,396 A | * | 2/1988 | Taylor et al. ................. | 330/10 |
| 5,077,539 A | * | 12/1991 | Howatt ......................... | 330/10 |
| 5,398,003 A | * | 3/1995 | Heyl et al. .................... | 330/10 |
| 5,617,058 A | * | 4/1997 | Adrian et al. ................. | 330/10 |

* cited by examiner

Primary Examiner—Khanh Van Nguyen
(74) Attorney, Agent, or Firm—Jay H. Maioli (57) ABSTRACT

A digital power amplifier includes a pulse width modulator for converting an input signal into a pulse width modulated signal according to a signal level of the input signal; an output stage, switching thereof being controlled by the pulse width modulated signal generated by the pulse width modulator; a pulse width modulation ratio detector for detecting a pulse width modulation ratio of the pulse width modulated signal generated by the pulse width modulator; and a control unit for disabling the switching operation of the output stage. The control unit disables the switching operation of the output stage when the pulse width modulation ratio detector detects that the pulse width modulation ratio is 50%.

18 Claims, 6 Drawing Sheets

DIGITAL POWER AMPLIFIER AND DIGITAL/ANALOG CONVERTER

BACKGROUND OF THE INVENTION

1. Field of the Invention

The present invention relates to digital power amplifiers and digital/analog converters. More specifically, the present invention relates to a digital power amplifier that can be suitably applied, for example, to a power amplifier for amplifying power of a signal in the audio frequency band by switching operation, and also relates to a digital/analog converter for converting a digital signal into an analog signal by switching operation.

2. Description of the Related Art

Signal amplifiers called class-D amplifiers are known as a form of amplifiers for signals in the audio frequency band.

Figure 6:
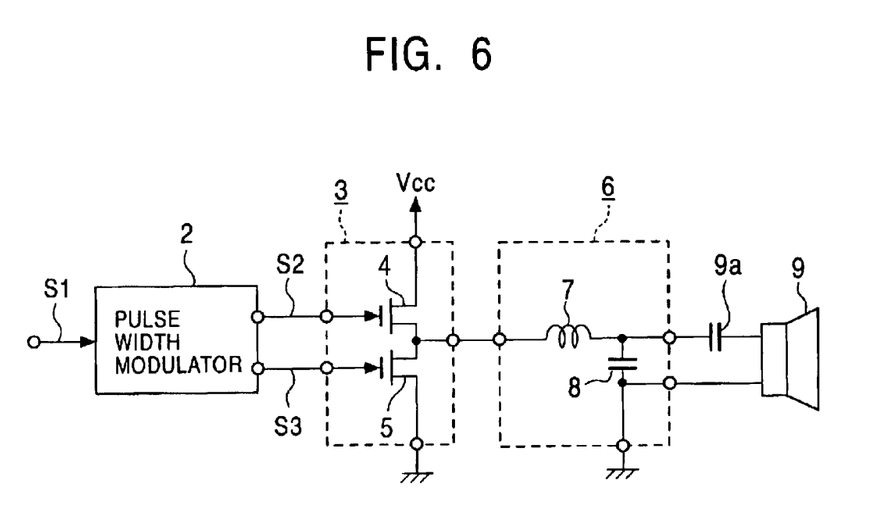
FIG. 6 is a circuit block diagram of a conventional class-D power amplifier.

FIG. 6 shows an example of conventional class-D power amplifier. The class-D power amplifier includes a pulse width modulator 2, a power switching circuit 3, and a low-pass filter 6. 9 denotes a speaker, and 9a denotes a capacitor for blocking DC current.

The power switching circuit 3 is implemented by an N-channel power MOSFET 4 and an N-channel power MOSFET 5. The source of the power MOSFET 4 and the drain of the power MOSFET 5 are connected in series with each other, the drain of the power MOSFET 4 is connected to a power supply Vcc, and the source of the power MOSFET 5 is grounded. The low-pass filter 6 is implemented in the form of an L-filter by a choke coil 7 and a capacitor 8.

Furthermore, a node of the series connection between the source of the power MOSFET 4 and the drain of the power MOSFET 5 is connected to an input end of the choke coil 7. A node between an output end of the choke coil 7 and one end of the capacitor 8 is connected to one drive signal input terminal of the speaker 9 via the capacitor 9a, and the other drive signal input terminal of the speaker 9 and the other end of the capacitor 8 are grounded.

A digital signal S1, for example, a PCM-encoded signal in the audio frequency band, is supplied to the input end of the pulse width modulator 2. The pulse width modulator 2 generates a PWM signal S2 that is pulse width modulated according to change in the signal level of the digital signal S1, and also generates a negative PWM signal S3 having an inverse phase with respect to that of the PWM signal S2. The PWM signal S2 output from the pulse width modulator 2 is supplied to the gate of the MOSFET 4, so that switching of the power MOSFET 4 is controlled according to change in the pulse width of the PWM signal S2. The PWM signal S3 is supplied to the gate of the power MOSFET 5, so that switching of the power MOSFET 5 is controlled according to change in the pulse width of the PWM signal S3.

The PWM signal S2 is pulse width modulated so as to have equal on-period and off-period in a reference period (to be described later), i.e., a duty ratio of 50%, when the signal level of the digital signal S1 is at zero level. The ratio of an on-period or an off-period in the reference period will be referred to herein as a PWM ratio. The PWM signal S2 is pulse width modulated so that the on-period increases and the off-period decreases proportionally as the signal level of the digital signal S1 increases in the positive direction from zero level, whereas the on-period decreases and the off-period increases as the signal level of the digital signal S1 increases in the negative direction from zero level.

The PWM signal S3 output from the pulse width modulator 2 is off when the PWM signal S2 is on in accordance with change in the signal level of the digital signal S1, whereas the PWM signal S3 is on when the PWM signal S2 is off. Accordingly, the power MOSFET 5 is controlled according to the PWM signal S3 so that it is off when the power MOSFET 4 is on whereas it is on when the power MOSFET 4 is off.

Thus, when the signal level of the digital signal S1 in the audio frequency band, supplied to the input end of the pulse width modulator 2, is increasing in the positive direction from zero level, in proportion to the increase, the amount of current that flows into the low-pass filter 6 from the power supply Vcc increases whereas the amount of current that flows out from the low-pass filter 6 to the ground decreases.

Conversely, when the signal level of the digital signal S1 supplied to the input end of the pulse width modulator 2 is decreasing from positive level toward zero level, in proportion to the decrease, the amount of current that flows into the low-pass filter 6 from the power supply Vcc decreases whereas the amount of current that flows out from the low-pass filter 6 to the ground increases. When the signal level of the digital signal S1 reaches zero level, the amount of current that flows into the low-pass filter 6 from the power supply Vcc and the amount of current that flows out from the low-pass filter 6 to the ground become equal, whereby output of the low-pass filter 6 also reaches zero level.

When the signal level of the digital signal S1 in the audio frequency band, supplied to the input end of the pulse width modulator 2, is increasing in the negative direction from zero level, in proportion to the increase, the amount of current that flows into the low-pass filter 6 from the power supply Vcc decreases whereas the amount of current that flows out from the low-pass filter 6 to the ground increases.

Conversely, when the signal level of the digital signal S1 supplied to the input end of the pulse width modulator 2 is decreasing from negative level toward zero level, in proportion to the decrease, the amount of current that flows into the low-pass filter 6 from the power supply Vcc increases whereas the amount of current that flows out from the low-pass filter 6 to the ground decreases. When the signal level of the digital signal S1 reaches zero level, the amount of current that flows into the low-pass filter 6 from the power supply Vcc and the amount of current that flows out from the low-pass filter 6 to the ground become equal, whereby output of the low-pass filter 6 also reaches zero level.

Thus, the conventional class-D power amplifier, having been described with reference to FIG. 6, efficiently amplifies power of a signal input thereto. However, the switching elements that constitute the main part of the class-D amplifier are not ideal; more specifically, switching elements that are available at the current technological level inevitably have on-resistance. Thus, even when the signal level of the digital signal S1 is at zero level, loss due to on-resistance associated with switching of the power MOSFET 4 is unavoidable.

In particular, if the digital signal S1 is an audio signal, the frequency of zero level crossing is high, raising a need for minimizing loss due to on-resistance of switching elements at zero level points.

SUMMARY OF THE INVENTION

The present invention has been made in view of the above, and it is an object of the present invention to provide a class-D power amplifier in which effect of switching loss at zero level points is appropriately alleviated.

To this end, the present invention, in one aspect thereof, provides a digital power amplifier including a pulse width modulator for converting an input signal into a pulse width modulated signal according to a signal level of the input signal; an output stage, switching thereof being controlled according to the pulse width modulated signal generated by the pulse width modulator; a detector for detecting the signal level of the input signal; and a control unit for disabling switching operation of the output stage when the detector detects that the signal level of the input signal is zero.

Accordingly, when the signal level of the input signal is at zero level or crossing zero level, switching operation of the output stage is disabled, so that waste of power in the output stage is reduced.

The present invention, in another aspect thereof, provides a digital/analog converter including a pulse width modulator for converting a digital input signal into a pulse width modulated-signal according to a signal level of the digital input signal; an output stage, switching thereof being controlled according to the pulse width modulated signal generated by the pulse width modulator; a detector for detecting the signal level of the digital input signal; and a control unit for disabling switching operation of the output stage when the detector detects that the signal level of the digital input signal is zero.

Accordingly, when the signal level of the digital input signal is at zero level or crossing zero level, switching operation of the output stage is disabled, so that waste of power in the output stage is reduced.

DESCRIPTION OF THE PREFERRED EMBODIMENTS

Preferred embodiments of digital power amplifier according to the present invention will now be described with reference to the accompanying drawings.

Figure 1:
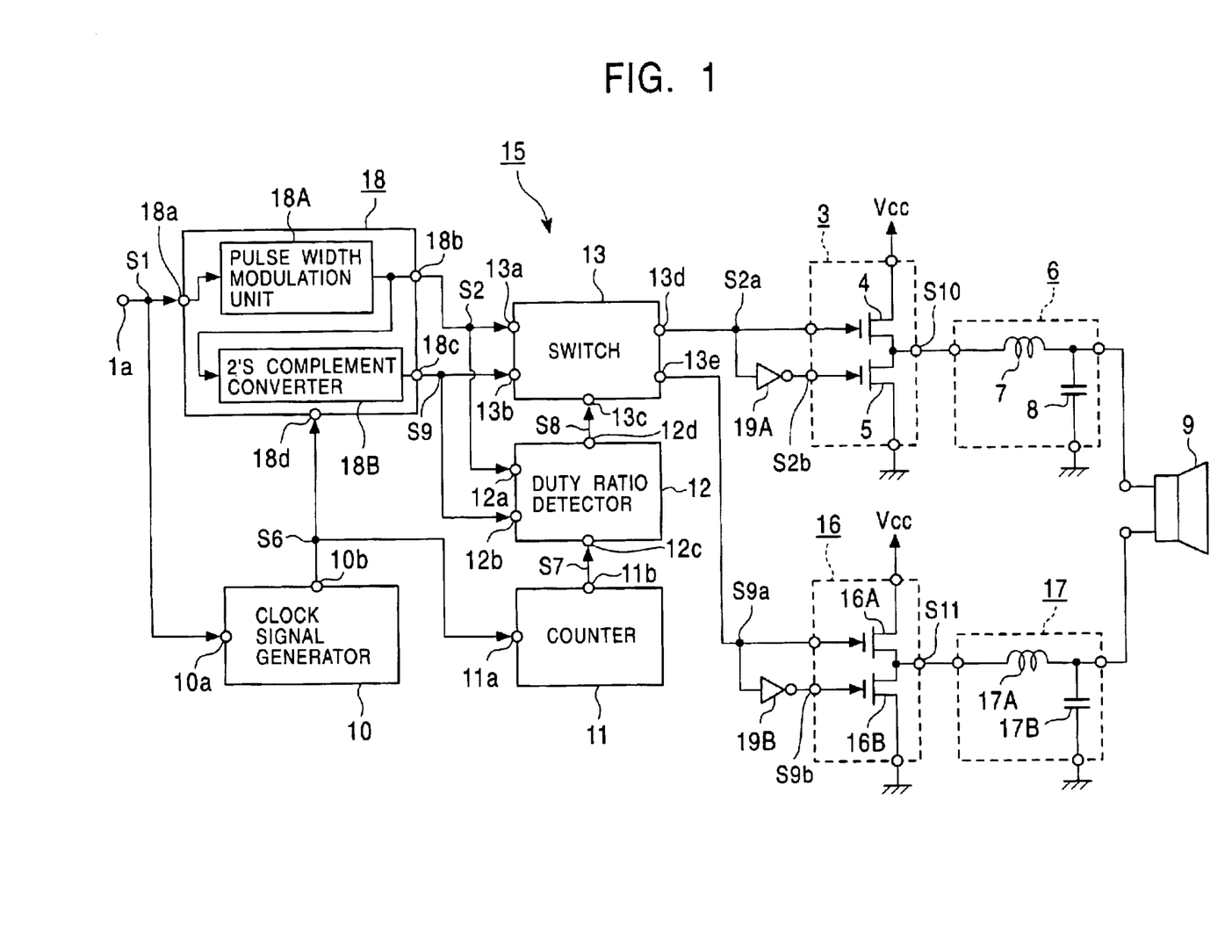
FIG. 1 is a block diagram of a class-D amplifier implemented by a digital amplifier according to a first embodiment of the present invention.

FIGS. 1 to 4 are related to class-D power amplifiers according to the present invention. FIG. 1 shows a class-D power amplifier according to a first embodiment of the present invention.

The class-D amplifier according to the first embodiment of the present invention will be described with reference to FIG. 1.

FIG. 1 is a block diagram showing main parts of a class-D power amplifier 15 according to the first embodiment of the present invention. The class-D power amplifier 15 includes power switching circuits 3 and 16, low-pass filters 6 and 17, a clock signal generator 10, a counter 11, a duty ratio detector 12, a switch 13, a pulse width modulator 18, and inverters 19A and 19B. The class-D power amplifier 15 is arranged so that a speaker 9 is balanced-driven by the power switching circuit 3 and the power switching circuit 16. That is, the class-D power amplifier 15 is an example of what is called BTL (Bridge Tied Load) or full-bridge configuration.

The power switching circuit 3 is implemented by an N-channel power MOSFET 4 and an N-channel power MOSFET 5. The source of the power MOSFET 4 and the drain of the power MOSFET 5 are connected in series with each other, the drain of the power MOSFET 4 is connected to a power supply Vcc, and the source of the power MOSFET 5 is grounded. Similarly, the power switching circuit unit 16 is implemented by an N-channel power MOSFET 16A and an N-channel power MOSFET 16B. The source of the power MOSFET 16A and the drain of the power MOSFET 16B are connected in series with each other, the drain of the power MOSFET 16A is connected to the power supply Vcc, and the source of the power MOSFET 16B is grounded.

The low-pass filter 6 is implemented by a choke coil 7 and a capacitor 8. One end of the choke coil 7 is connected to a node of the series connection between the source of the power MOSFET 4 and the drain of the power MOSFET 5. The other end of the choke coil 7 and one end of the capacitor 8 are connected to an output terminal of the low-pass filter 6, and the other end of the capacitor 8 is grounded. Similarly, the low-pass filter 17 is implemented by a choke coil 17A and a capacitor 17B. One end of the choke coil 17A is connected to a node of the series connection between the source of the power MOSFET 16A and the drain of the power MOSFET 16B. The other end of the choke coil 17A and one end of the capacitor 17B are connected to an output terminal of the low-pass filter 17, and the other end of the capacitor 17B is grounded. Furthermore, one signal input terminal of the speaker 9 is connected to the output terminal of the low-pass filter 6, and the other signal input terminal of the speaker 9 is connected to the output terminal of the low-pass filter 17.

The pulse width modulator 18 includes a pulse width modulation unit 18A and a 2's complement converter 18B. The input end of the pulse width modulation unit 18A is connected to a signal input terminal 1a via an input terminal 18a. The output end of the pulse width modulation unit 18A is connected to a first output terminal 18b and to the input end of the 2's complement converter 18B. The output end of the 2's complement converter 18B is connected to a second output terminal 18c.

The first output terminal 18b of the pulse width modulator 18 is connected to a first input terminal 13a of the switch 13 and to a first input terminal 12a of the duty ratio detector 12. The second output terminal 18c of the pulse width modulator 18 is connected to a second input terminal 13b of the switch 13 and to a second input terminal 12b of the duty ratio detector 12. The signal input terminal 1a is connected to an input terminal 10a of the clock signal generator 10, and a clock signal output terminal 10b of the clock signal generator 10 is connected to a clock signal input terminal 18d of the pulse width modulator 18 and to a clock signal input terminal 11a of the counter 11.

The clock signal generator 10 generates a clock signal S6 shown in part F of FIG. 2, having a cyclic period t (hereinafter referred to as a reference period of PWM signal), and locked to (synchronized with) a clock signal for the digital signal S1 input to the signal input terminal 1a. The clock signal S6 is supplied to the clock signal input terminal 18d of the pulse width modulator 18 and to the clock signal input terminal 11a of the counter 11. The frequency fc of the clock signal S6 is, for example, 16 times the sampling frequency fs of the digital signal S1; thus, assuming fs=48 kHz, fc=48 kHz×16=768 kHz. The reference period of PWM signal is the reciprocal of the clock frequency fc (1/fc). The clock signal S6 of the reference period, shown in part F of FIG. 2, uses rising edges thereof for timing reference, and does not reference positions of falling edges in this embodiment. Thus, duty ratio of the clock signal S6 is irrelevant to the gist of the present invention.

A first output terminal 13d of the switch 13 is connected to the gate of the power MOSFET 4 in the power switching circuit 3, and is also connected to the gate of the power MOSFET 5 via the inverter 19A. A second output terminal 13e of the switch 13 is connected to the gate of the power MOSFET 16A in the power switching circuit 16, and is also connected to the gate of the power MOSFET 16B via the inverter 19B.

The node between the source of the power MOSFET 4 and the drain of the power MOSFET 5 is connected to one of the signal input terminals of the speaker 9 via the low-pass filter 6, and the node between the source of the power MOSFET 16A and the drain of the power MOSFET 16B is connected to the other signal input terminal of the speaker 9 via the low-pass filter 17.

Next, operation of the class-D power amplifier 15 according to the first embodiment of the present invention, shown in FIG. 1, will be described with reference to a signal waveform chart shown in FIG. 2.

Figure 4:
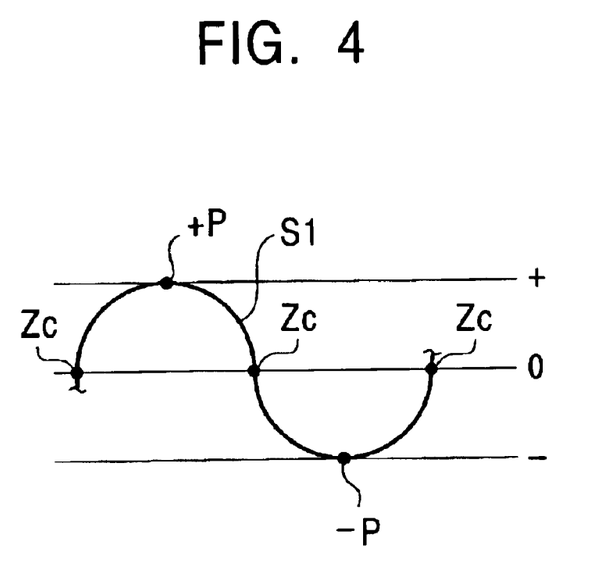
FIG. 4 is a signal waveform chart for explaining the first and second embodiments.

Also in the first embodiment, a digital signal S1, for example, a digital signal in the audio frequency band, is input from the signal input terminal 1a to the input terminal 18a of the pulse width modulator 18. FIG. 4 illustrates the digital signal S1 in the form of an analog signal for convenience of description. Referring to FIG. 4, the signal level of the digital signal S1 reaches a maximum value in the positive level range at a point indicated by +P, and reaches a maximum value in the negative level range at a point indicated by −P. Furthermore, the signal level of the digital signal S1 reaches zero level at points indicated by Zc, which will be referred to as zero crossing points.

Figure 2:
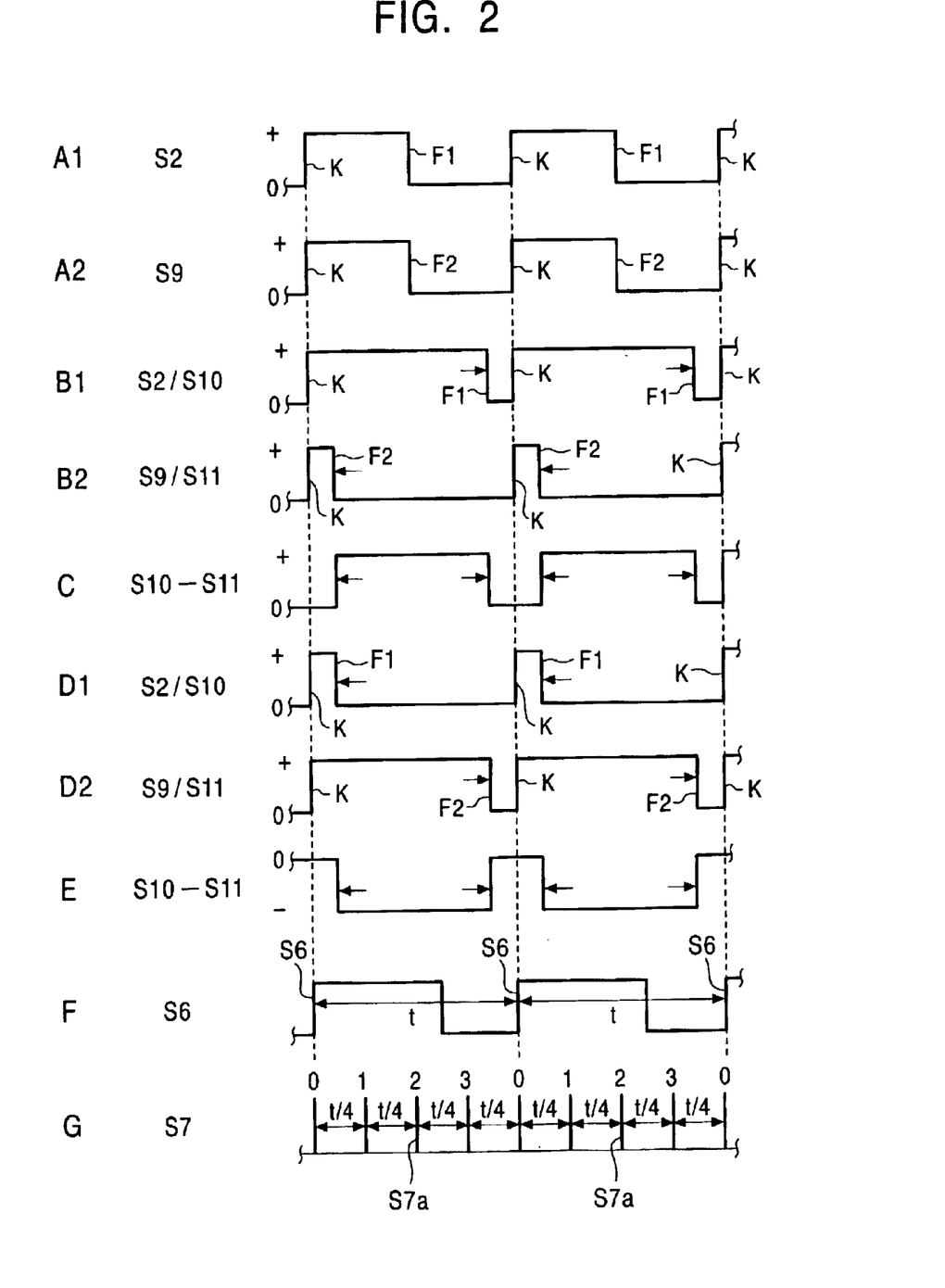
FIG. 2 is a signal waveform chart for explaining the first embodiment.

Based on the clock signal S6 having the reference period t, shown in part F of FIG. 2, generated by the clock signal generator 10 so as to lock to the clock signal for the digital signal S1 supplied via the input terminal 10a, and supplied to the pulse width modulator 18 via the clock signal input terminal 18d, and based on the digital signal S1 supplied to the pulse width modulator 18 via the input terminal 18a, the pulse width modulation unit 18A in the pulse width modulator 18 generates a PWM signal S2. The PWM signal S2 has fixed edges K locked to rising edges of the clock signal S6, and shiftable edges F1 that are position-modulated according to change in the signal level of the digital signal S1 between adjacent pairs of the fixed edges K. The PWM signal S2 is output from the first output terminal 18b. A PWM signal having a pulse width extending from a fixed edge K to a shiftable edge F1 in a reference period t, generated according to the input signal level, will be hereinafter referred to as a single-sided PWM signal.

Furthermore, the PWM signal S2 is supplied to the 2's complement converter 18B. The 2's complement converter 18B generates a PWM signal S9 that is 2's complement of the PWM signal S2 and that has a fixed edge K and a shiftable edge F2. The PWM signal S9 is output from the second output terminal 18c.

When the signal level of the digital signal S1 is at a zero crossing point Zc shown in FIG. 4, the PWM signal S2 output from the first output terminal 18b has a duty ratio of 50% as shown in part A1 of FIG. 2. When the signal level of the digital signal S1 changes so as to increase from the zero crossing point Zc toward the point +P shown in FIG. 4, the PWM signal S2 output from the first output terminal 18b is modulated so that the duty ratio thereof increases as shown in part B1 of FIG. 2, whereas the PWM signal S9 output from the second output terminal 18c is modulated so that the duty ratio thereof, which has been 50% as shown in part A2 of FIG. 2, decreases as shown in part B2 of FIG. 2.

When the signal level of the digital signal S1 changes so as to decrease from the point +P to a zero crossing point Zc shown in FIG. 4, the PWM signal S2 is modulated so as to change from the state shown in part B1 of FIG. 2 to the state shown in part A1 of FIG. 2, and the PWM signal S9 is modulated so as to change from the state shown in part B2 of FIG. 2 to the state shown in part A2 of FIG. 2.

When the signal level of the digital signal S1 changes so as to increase from the zero crossing point Zc toward the point −P shown in FIG. 4, the PWM signal S2 output from the first output terminal 18b is modulated so that the duty ratio thereof, which has been 50% as shown in part A1 of FIG. 2, decreases as shown in part D1 of FIG. 2, whereas the PWM signal S9 output from the second output terminal 18c is modulated so that the duty ratio thereof, which has been 50% as shown in part A2 of FIG. 2, increases as shown in part D2 of FIG. 2.

When the signal level of the digital signal S1 changes so as to decrease from the point −P from a zero crossing point Zc shown in FIG. 4, the PWM signal S2 is modulated so as to change from the state shown in part D1 of FIG. 2 to the state shown in part A1 of FIG. 2, and the PWM signal S9 is modulated so as to change from the state shown in part D2 of FIG. 2 to the state shown in part A2 of FIG. 2.

The counter 11 generates a detection pulse signal S7 based on the clock signal S6 input to the clock signal input terminal 11a. As shown in part G of FIG. 2, in the detection pulse signal S7, pulses 1, 2, and 3 having a period of t/4, i.e., one quarter of the reference period t of the clock signal S6, is generated, and the detection pulse signal S7 is reset at each rising edge of the clock signal S6. The detection pulse signal S7 is supplied to the duty ratio detector 12 via a detection signal input terminal 12c.

The duty ratio detector 12 receives input of the PWM signal S2 from the first output terminal 18b via the first input terminal 12a, and input of the PWM signal S9 from the second output terminal 18c via the second input terminal 12b. The duty ratio detector 12 compares each of the PWM signals S2 and S9 with the detection pulse signal S7. If it is detected as a result of the comparison that the polarities of the PWM signals S2 and S9 are both positive at the position of the pulse 1 of the detection pulse signal S7, the polarities of the PWM signals S2 and S9 change from positive to zero at the position of the pulse 2, and that the polarities of the PWM signals S2 and S9 are zero at the position of the pulse 3, it is determined that the PWM signals S2 and S9 each have a duty ratio of 50% and therefore that the signal level of the digital signal S1 is at a zero crossing point. Accordingly, a zero crossing point signal is transmitted from a detection signal output terminal 12d to a detection signal input terminal 13c as a detection signal S8 throughout the period t. That is, in the first embodiment shown in FIG. 1, the counter 11 and the duty ratio detector 12 constitute detection means for detecting a PWM ratio.

In the switch 13, unless the zero crossing point signal is transmitted from the duty ratio detector 12, the first input terminal 13a is directly connected to the first output terminal 13d, and the second input terminal 13b is directly connected to the second output terminal 13e. Only in a period t in which the zero crossing point signal is transmitted, the direct connections are disabled, and a control signal for maintaining the power MOSFET 4 off (and thus the power MOSFET 5 on) is transferred to the gate of the power MOSFET 4 from the first output terminal 13d, and a control signal for maintaining the power MOSFET 16A off (and thus the power MOSFET 16B on) is transferred to the gate of the power MOSFET 16A from the second output terminal 13e, whereby switching operations of the power switching circuits 3 and 16 are disabled.

Furthermore, delaying units for delaying the PWM signals S2 and S9 by the period t is provided respectively in association with the first input terminal 13a and the second input terminal 13b of the switch 13, so that timing of transfer of a zero crossing point signal is adjusted in relation to the PWM signals S2 and S9.

Thus, when the signal level of the digital signal S1 is changing so as to increase or decrease between a zero crossing point and the maximum value +P in the positive level range (not including the zero crossing point), the PWM signal S2 supplied to the gate of the power MOSFET 4 is such that the shiftable edges F1 thereof shift between the states in the waveforms shown respectively in parts A1 and B1 of FIG. 2, and switching of the power MOSFET 4 is controlled accordingly. Furthermore, a PWM signal obtained by phase-inverting the PWM signal S2 by the inverter 19A is supplied to the gate of the power MOSFET 5, and switching of the power MOSFET 5 is controlled accordingly. Accordingly, a power switching signal S10 output from the node between the source of the power MOSFET 4 and the drain of the power MOSFET 5 has the same phase as that of the PWM signal S2, as shown in part B1 of FIG. 2.

Furthermore, when the signal level of the digital signal S1 is changing so as to increase or decrease between a zero crossing point and the maximum value +P in the positive level range (not including the zero crossing point), the PWM signal S9 supplied to the gate of the power MOSFET 16A is such that the shiftable edges F2 thereof shift between the states in the waveforms respectively shown in parts A2 and B2 of FIG. 2, and switching of the power MOSFET 16A is controlled accordingly. Furthermore, a PWM signal obtained by phase-inverting the PWM signal S9 by the inverter 19B is supplied to the gate of the power MOSFET 16B, and switching of the power MOSFET 16B is controlled accordingly. Accordingly, a power switching signal S11 output from the node between the source of the power MOSFET 16A and the drain of the power MOSFET 16B has the same phase as that of the PWM signal S9, as shown in part B2 of FIG. 2.

On the other hand, when the signal level of the digital signal S1 is changing so as to increase or decrease between a zero crossing point and the maximum value −P in the negative level range (not including the zero crossing point), the PWM signal S2 supplied to the gate of the power MOSFET 4 is such that the shiftable edges F1 thereof shift between the states in the waveforms respectively shown in parts A1 and D1 of FIG. 2, and switching of the power MOSFET 4 is controlled accordingly. Furthermore, a PWM signal obtained by phase-inverting the PWM signal S2 by the inverter 19A is supplied to the gate of the power MOSFET 5, and switching of the power MOSFET 5 is controlled accordingly. Accordingly, the power switching signal S10 output from the node between the source of the power MOSFET 4 and the drain of the power MOSFET 5 has the same phase as that of the PWM signal S2, as shown in part D1 of FIG. 2.

Furthermore, when the signal level of the digital signal S1 is changing so as to increase or decrease between a zero crossing point and the maximum value −P in the negative level range (not including the zero crossing point), the PWM signal S9 supplied to the gate of the power MOSFET 16A is such that the shiftable edges F2 thereof shift between the states in the waveforms respectively shown in parts A2 and D2 of FIG. 2, and switching of the power MOSFET 16A is controlled accordingly. Furthermore, a PWM signal obtained by phase-inverting the PWM signal S9 by the inverter 19B is supplied to the gate of the power MOSFET 16B, and switching of the power MOSFET 16B is controlled accordingly. Accordingly, the power switching signal S11 output from the node between the source of the power MOSFET 16A and the drain of the power MOSFET 16B has the same phase as that of the PWM signal S9, as shown in part D2 of FIG. 2.

Accordingly, when the signal level of the digital signal S1 is changing so as to increase or decrease between a zero crossing point and the maximum value +P in the positive level range (not including the zero crossing point), the speaker 9 is driven via the low-pass filters 6 and 17 by a positive power switching signal S10–S11 that has been pulse width modulated in both directions as shown in part C of FIG. 2. On the other hand, when the signal level of the digital signal S1 is changing so as to increase or decrease between a zero crossing point and the maximum value −P in the negative level range (not including the zero crossing point), the speaker 9 is driven via the low-pass filters 6 and 17 by a negative power switching signal S10–S11 that has been modulated in both directions as shown in part E of FIG. 2. A PWM signal having a pulse width extending from a shiftable edge F1 to a shiftable edge F2 in a reference period t as shown in part C of FIG. 2, generated according to the signal level of the input signal, will hereinafter be referred to as a double-sided PWM signal.

When the signal level of the digital signal S1 is at a zero crossing point Zc as shown in FIG. 4, switching operations of the power switching circuits 3 and 16 are disabled during the period t.

Although the respective gates of the power MOSFETs 4 and 5 and the power MOSFETs 16A and 16B are directly driven by outputs of the switch 13 in the first embodiment shown in FIG. 1, pre-driver circuits may be provided respectively between the first output terminal 13d of the switch 13 and the gates of the power MOSFETs 4 and 5 and between the second output terminal 13e of the switch 13 and the gates of the power MOSFETs 16A and 16B so that the power MOSFETs 4 and 5 and the power MOSFETs 16A and 16B will be driven respectively via the pre-driver circuits.

According to the class-D power amplifier according to the first embodiment of the present invention, shown in FIG. 1, in a period t when the signal level of the digital signal S1 input to the class-D power amplifier is at a zero crossing point, the power MOSFET 4 is maintained off. Accordingly, waste of power that occurs if the power MOSFET 4 is driven to ON in the period t of zero crossing point is avoided. Furthermore, occurrence of electrical noise associated with switching operation of the power MOSFET 4 in the period t of zero crossing point is avoided.

In particular, if the digital signal S1 is an audio signal, in which the frequency of zero level crossing is high, advantageously, waste of power supplied from the power supply to the class-D power amplifier is avoided, and occurrence of electrical noise in the class-D amplifier is suppressed.

In the class-D power amplifier according to the first embodiment of the present invention, shown in FIG. 1, the pulse width modulator 18 includes the 2's complement converter 18B, which converts the PWM signal S2 into the PWM signal S9 that is 2's complement of the PWM signal S2. Alternatively, in a class-D power amplifier according to a second embodiment of the present invention, a phase inverter 18B' is provided in place of the 2's complement converter 18B, so that a PWM signal S9 having an inverse phase as that of the PWM signal S2 is generated. The construction of the class-D power amplifier according to the second embodiment is otherwise the same as shown in FIG. 1.

Figure 3:
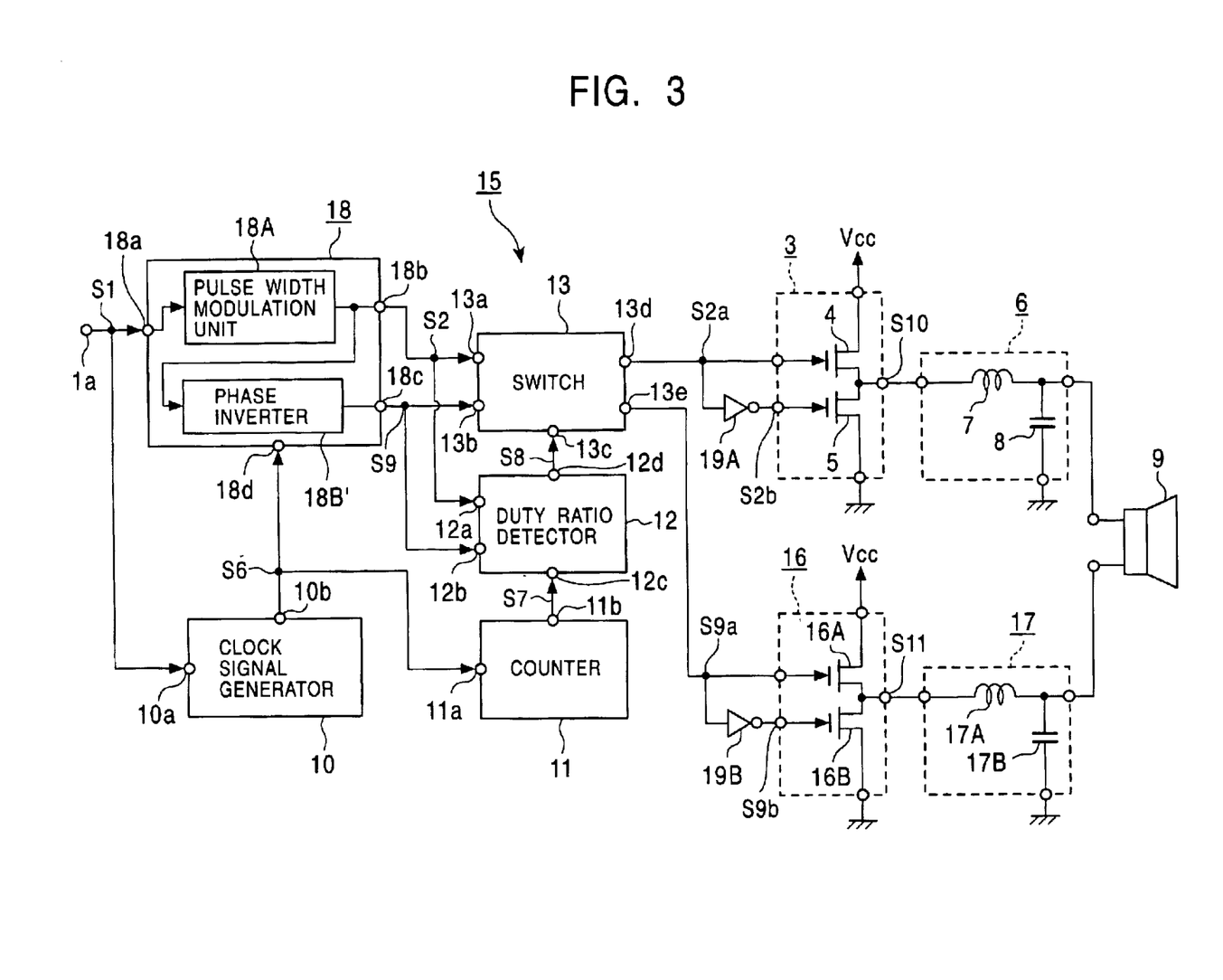
FIG. 3 is a block diagram of a class-D amplifier implemented by a digital amplifier according to a second embodiment of the present invention.

It is to be readily understood that the same advantages as in the first embodiment shown in FIG. 1 are achieved by the second embodiment shown in FIG. 3.

The first embodiment shown in FIG. 1 and the second embodiment shown in FIG. 3 have been described in relation to a case where the speaker 9 is provided as a load of the power switching circuits 3 and 16. However, the present invention is not limited thereto, and, for example, an inductive rotation apparatus such as an induction motor may be provided as a load.

The first embodiment shown in FIG. 1 and the second embodiment shown in FIG. 3 have been described in relation to a case where the power MOSFETs constituting the power switching circuits 3 and 16 are controlled so that the power MOSFETs 4 and 16A connected to the power supply Vcc are turned off and the power MOSFETs 5 and 16B connected to the ground are turned on when the signal level of the digital signal S1 input to the digital amplifier is at a zero crossing point. However, the present invention is not limited thereto, and the power MOSFETs may be controlled so that the power MOSFETs 4 and 16A connected to the power supply Vcc are turned on and power MOSFETs 5 and 16B connected to the ground are turned off.

Figure 5:
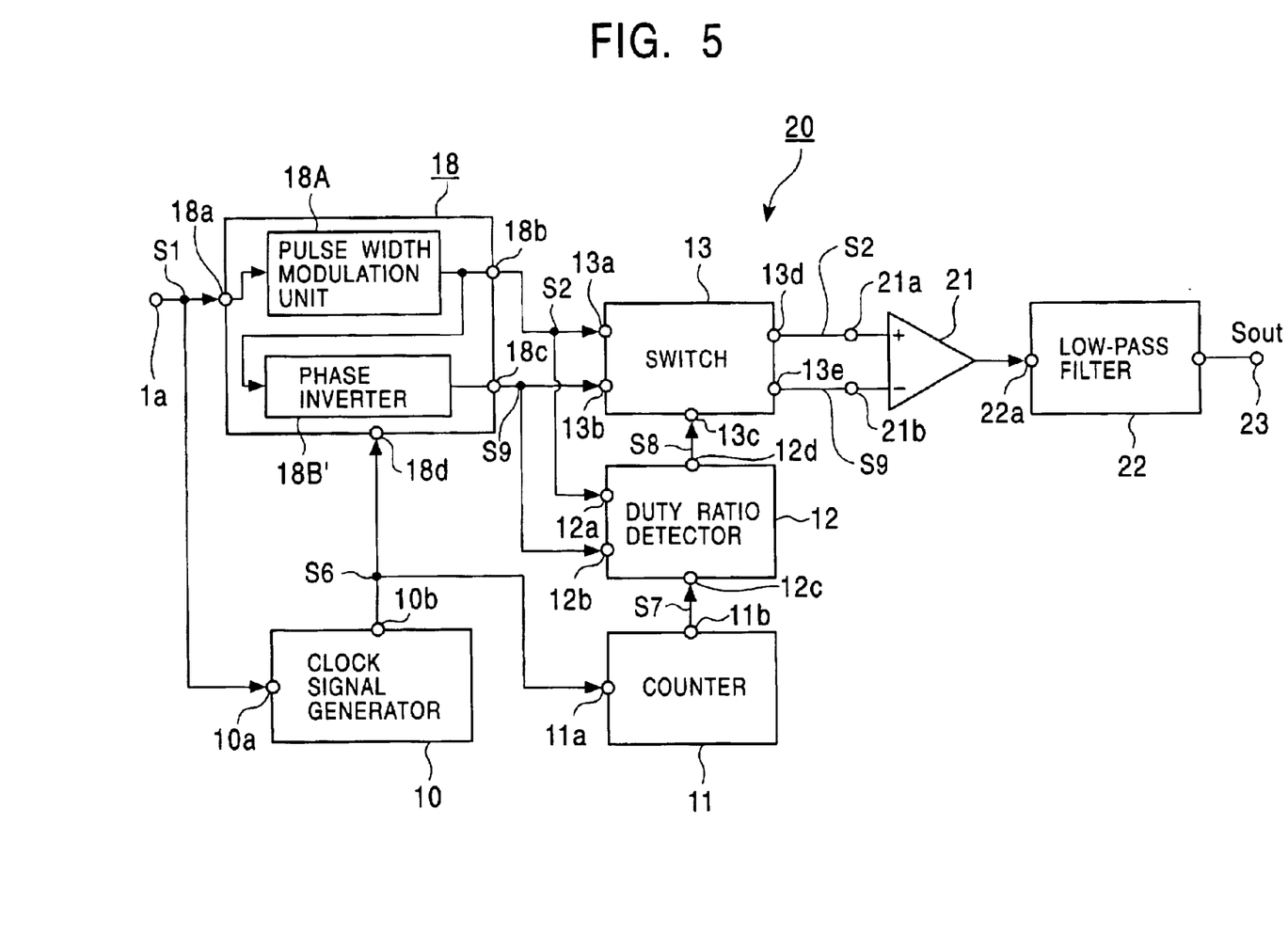
FIG. 5 is a block diagram of a digital/analog converter according to an embodiment of the present invention.

Furthermore, according to the present invention, a digital/analog converter may be constructed by providing an output terminal for outputting a signal instead of terminating the power switching circuits 3 and 16 by a load. Furthermore, in the digital/analog converter, the power switching circuits 3 and 16 may be replaced with signal switching circuits. FIG. 5 shows an example construction of digital/analog converter according to the present invention. A digital/analog converter 20 shown in FIG. 5 includes the clock signal generator 10, the counter 11, the duty ratio detector 12, the switch 13, and the pulse width modulator 18 constructed the same as in the class-D power amplifier shown in FIG. 3, and further includes an operational amplifier 21 having a non-inverting input 21a and an inverting input 21b, to which the PWM signals S2 and S9 are input respectively for subtraction. The result of the subtraction is cleared of high-frequency components such as the reference clock signal by a low-pass filter 22, whereby a desired analog signal Sout is output from an output terminal 23. Although the pulse width modulator 18 shown in FIG. 5 includes the phase inverter 18B', alternatively, the 2's complement converter 18B may be provided, as in the first embodiment shown in FIG. 1.

Furthermore, although the description has been made in relation to a case where fixed edges K are associated with rising edges and shiftable edges F1 and F2 are associated with falling edges in the signal waveforms of the signals S2 and S3, the arrangement may be such that the fixed edges K are associated with falling edges and the shiftable edges F1 and F2 are associated with rising edges, the criterion for detection by the duty ratio detector 12 being changed accordingly.

The description has been made in relation to a case where the detection pulse signal S7 having a period of t/4, i.e., a quarter of the clock signal of the reference period t, is used for detection of PWM signals that have a duty ratio of 50% when the signal level of the digital signal S1 input to the digital amplifier is at a zero crossing point. However, the present invention is not limited thereto, and, for example, the clock signal may be counted by a counter having a period that is considerable shorter than the period t and obtained by dividing the period t by an integer, thereby obtaining a middle point of the period t, the PWM signals having a duty ratio of 50% being detected using the middle point. Furthermore, whether the PWM ratio of the PWM signal S2 output from the pulse width modulator 18 is 50% can also be determined by monitoring the value of the digital signal S1 or by monitoring an output value of a Δ-Σ modulation circuit constituting part of the pulse width modulator 18.

The present invention is not limited to the embodiments described above, and various modifications can be made without departing from the spirit of the present invention.

What is claimed is:

1. A digital power amplifier comprising:
   pulse width modulation means for converting an input signal into an output pulse width modulated signal according to a signal level of the input signal;
   a switching output stage, switching thereof being controlled according to the pulse width modulated signal generated by said pulse width modulation means;
   detection means for detecting a signal level of the output of said pulse width modulation means; and
   control means for disabling the switching of said switching output stage when said detection means detects that the signal level of the output of the pulse width modulation means is zero.

2. The digital power amplifier according to claim 1, wherein said control means controls said switching output stage so that said output stage is one of on and off when said detection means detects that the signal level of the output of said pulse width modulation means is zero.

3. The digital power amplifier according to claim 1, wherein said control means outputs a fixed value to said switching output stage when said detection means detects that the signal level of the output of said pulse width modulation means is zero, whereas said control means outputs the pulse width modulated signal generated by said pulse width modulation means to said switching output stage when said detection means detects that the signal level of the output of said pulse width modulation means is not zero.

4. The digital power amplifier according to claim 1, wherein said detection means detects a pulse width modulation ratio of the pulse width modulated signal generated by said pulse width modulation means and determines that the signal level of the output of the pulse width modulation means is zero when the pulse width modulation ratio is 50%.

5. The digital power amplifier according to claim 4, wherein said control means controls said output stage so that said switching output stage is one of on and off when said detection means detects that the pulse width modulation ratio of the pulse width modulated signal is 50%.

6. The digital power amplifier according to claim 4, wherein said control means outputs a fixed value to said switching output stage when said detection means detects that the pulse width modulation ratio of the pulse width modulated signal is 50%, whereas said control means outputs the pulse width modulated signal generated by said pulse width modulation means to said switching output stage when said detection means detects that the pulse width modulation ratio of the pulse width modulated signal is not 50%.

7. The digital power amplifier according to claim 1,
wherein said pulse width modulation means comprises first pulse width modulation means and second pulse width modulation means for converting the input signal into two single-sided pulse width modulated signals having pulse widths that are 2's complements of each other,
said switching output stage comprises first power switching means, switching thereof being controlled according to the pulse width modulated signal from said first pulse width modulation means, and second power switching means, switching thereof being controlled according to the pulse width modulated signal from said second pulse width modulation means, and
said control means disables switching operations of said first power switching means and said second power switching means when said detection means detects that the signal level of the output of the pulse width modulation means is zero.

8. The digital power amplifier according to claim 7, wherein said control means controls said first power switching means and said second power switching means so that both thereof are off when said detection means detects that the signal level of the output of the pulse width modulation means is zero.

9. The digital power amplifier according to claim 7, wherein said detection means detects a pulse width modulation ratio of one of the pulse width modulated signal generated by said first pulse width modulation means and the pulse width modulated signal generated by said second pulse width modulation means and determines that the signal level of the output of the pulse width modulation means is zero when the pulse width modulation ratio is 50%.

10. The digital power amplifier according to claim 1,
wherein said pulse width modulation means comprises first pulse width modulation means for converting the input signal into a first pulse width modulated signal according to the signal level of the input signal and second pulse width modulation means for generating a second pulse width modulated signal by inverting the first pulse width modulated signal generated by said first pulse width modulation means,
said switching output stage comprises first power switching means, switching thereof being controlled according to the first pulse width modulated signal generated by said first pulse width modulation means, and second power switching means, switching thereof being controlled according to the second pulse width modulated signal generated by said second pulse width modulation means, and
said control means disables switching operations of said first power switching means and said second power switching means when said detection means detect that the signal level of the output of the pulse width modulation means is zero.

11. The digital power amplifier according to claim 10, wherein mean control means controls said first power switching means and said second power switching means so that both are off when said detection means detects that the signal level of the output of the pulse width modulation means is zero.

12. The digital power amplifier according to claim 10, wherein said detection means detects a pulse width modulation ratio of one of the first pulse width modulated signal generated by said first pulse width modulation means and the second pulse width modulated signal generated by said second pulse width modulation means, and determines that the signal level of the output of the pulse width modulation means is zero when the pulse width modulation ratio is 50%.

13. A digital/analog converter comprising:
pulse width modulation means for converting a digital input signal into an output pulse width modulated signal according to a signal level of the digital input signal;
a switching output stage, switching thereof being controlled according to the pulse width modulated signal generated by said pulse width modulation means;
detection means for detecting a signal level of the output of the pulse width modulation means; and
control means for disabling the switching of said switching output stags when said detection means detects that the signal level of the output of the pulse width modulation means is zero.

14. The digital/analog converter according to claim 13, wherein said control means controls said switching output stage so that said switching output stage is one of on and off when said detection means detects that the signal level of the output of the pulse width modulation means signal is zero.

15. The digital/analog converter according to claim 13, wherein said control means outputs a fixed value to said switching output stage when said detection means detects that the signal level of the output of the pulse width modulation means is zero, whereas said control means outputs the pulse width modulated signal generated by said pulse width modulation means to said switching output stage when said detection means detects that the signal level of the output of the pulse width modulation means is not zero.

16. The digital/analog converter according to claim 13, wherein said detection means detects a pulse width modulation ratio of the pulse width modulation signal generated by said pulse width modulation means and determine that the signal level of the output of the pulse width modulation means is zero when the pulse width modulation ratio is 50%.

17. The digital/analog converter according to claim 16, wherein said control means controls said switching output stage so that said switching output stage is one of on and off when said detection means detects that the pulse width modulation ratio of the pulse width modulated signal is 50%.

18. The digital/analog converter according to claim 16, wherein said control means outputs a fixed value to said switching output stage when said detection means detects that the pulse width modulation ratio of the pulse width modulated signal is 50%, whereas said control means outputs the pulse width modulated signal generated by said pulse width modulation means to said switching output stage when said detection means detects that the pulse width modulation ratio of the pulse width modulated signal is not 50%.

* * * * *